(12) United States Patent
Lee et al.

(10) Patent No.: US 11,899,241 B2
(45) Date of Patent: Feb. 13, 2024

(54) HIGH REFRACTIVE INDEX WAVEGUIDE FOR AUGMENTED REALITY

(71) Applicant: Huawei Technologies Co., Ltd., Shenzhen (CN)

(72) Inventors: Gangok Lee, Bothell, WA (US); Zhiqiang Liu, Redmond, WA (US); Wei Zhou, Sammamish, WA (US); Akash Arora, Normandy Park, WA (US); Angus Wu, Bellevue, WA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 121 days.

(21) Appl. No.: 17/192,518

(22) Filed: Mar. 4, 2021

(65) Prior Publication Data

US 2021/0191040 A1   Jun. 24, 2021

Related U.S. Application Data

(63) Continuation of application No. PCT/CN2019/082222, filed on Apr. 11, 2019.

(60) Provisional application No. 62/728,309, filed on Sep. 7, 2018.

(51) Int. Cl.
*G02B 6/122* (2006.01)
*G02B 6/132* (2006.01)
*G03F 7/16* (2006.01)

(52) U.S. Cl.
CPC ........... *G02B 6/1223* (2013.01); *G02B 6/132* (2013.01); *G03F 7/16* (2013.01)

(58) Field of Classification Search
CPC ........ G02B 6/1223; G02B 6/132; G02B 6/34; G03F 7/16
See application file for complete search history.

(56) References Cited

U.S. PATENT DOCUMENTS

| | | | |
|---|---|---|---|
| 4,725,110 A | 2/1988 | Glenn et al. | |
| 5,066,133 A | 11/1991 | Brienza | |
| 5,675,691 A | 10/1997 | Edlinger | |
| 6,621,959 B2 | 9/2003 | Lin | |
| 7,764,413 B2 | 7/2010 | Levola | |
| 8,611,014 B2 | 12/2013 | Valera | |
| 10,302,826 B1 * | 5/2019 | Meyer Timmerman Thijssen ...... | G02B 27/0101 |
| 11,137,536 B2 * | 10/2021 | Colburn ............. | G02B 27/0172 |
| 2004/0013805 A1 | 1/2004 | Nagata et al. | |
| 2004/0141108 A1 | 7/2004 | Tanaka et al. | |
| 2007/0263973 A1 | 11/2007 | Van Laere et al. | |
| 2014/0204438 A1 | 7/2014 | Yamada | |

(Continued)

FOREIGN PATENT DOCUMENTS

| | | |
|---|---|---|
| CN | 1462242 A | 12/2003 |
| CN | 1483150 A | 3/2004 |
| CN | 102016658 A | 4/2011 |

(Continued)

*Primary Examiner* — John Bedtelyon
(74) *Attorney, Agent, or Firm* — Conley Rose, P.C.

(57) ABSTRACT

Disclosed is an Augmented Reality (AR) optical waveguide. The AR optical waveguide includes a transparent substrate including a user proximate surface and a user distal surface. The AR optical waveguide also includes a slant etched diffractive grating included on the user distal surface of the transparent substrate. The slant etched diffractive grating includes a refractive index of greater than or equal to 2.0.

18 Claims, 9 Drawing Sheets

(56) References Cited

U.S. PATENT DOCUMENTS

2015/0016777 A1    1/2015   Abovitz
2019/0129180 A1    5/2019   Mohanty

FOREIGN PATENT DOCUMENTS

| | | |
|---|---|---|
| CN | 103675969 A | 3/2014 |
| CN | 104536262 A | 4/2015 |
| CN | 105005106 A | 10/2015 |
| CN | 107430217 A | 12/2017 |
| CN | 107546102 A | 1/2018 |
| CN | 107735716 A | 2/2018 |
| EP | 1855131 A1 | 11/2007 |
| EP | 2877884 A2 | 6/2015 |
| JP | H01200206 A | 8/1989 |
| JP | 2669840 B2 | 10/1997 |
| WO | 2009135982 A1 | 11/2009 |
| WO | 2014016343 A2 | 1/2014 |

\* cited by examiner

HIGH REFRACTIVE INDEX WAVEGUIDE FOR AUGMENTED REALITY

CROSS-REFERENCE TO RELATED APPLICATIONS

This application is a continuation of International Application No. PCT/CN2019/082222 filed on Apr. 11, 2019, by Huawei Technologies Co., Ltd., and titled "High Refractive Index Waveguide For Augmented Reality," which claims priority to U.S. Provisional Application No. 62/728,309, filed on Sep. 7, 2018, and entitled "High Refractive Index Waveguide For Augmented Reality," which are each incorporated herein by reference as if reproduced in their entirety.

TECHNICAL FIELD

The present disclosure is generally related to Augmented Reality (AR)/Mixed Reality (MR) devices, and is specifically related to an optical waveguide with a high refractive index for use in an AR/MR screen.

BACKGROUND

Augmented Reality (AR), also known as Mixed Reality (MR), is a technology that provides a user with an augmented perception of reality by overlaying computer generated sensory input onto real-world sensory input. The goal of such technology is to constructively or destructively interfere with user perception by adding or subtracting, respectively, visual elements from the user's field of view. This may allow a user to experience computer generated imagery that is seamlessly applied over real-world objects. For example, an AR system may allow a user to virtually look inside solid real-world objects, view real-world objects overlaid with corresponding graphical data items, view real-world objects with overlaid virtual control points, etc.

SUMMARY

In an embodiment, the disclosure includes an AR optical waveguide comprising a transparent substrate including a user proximate surface and a user distal surface. The AR optical waveguide also includes a slant etched diffractive grating included on the user distal surface of the transparent substrate. The slant etched diffractive grating includes a refractive index of greater than or equal to 2.0. By employing material with a greater refractive index, a greater field of view (FOV) can be achieved for the AR optical waveguide. Further, employing an increased reactive index mitigates loss of computer generated light, which increases the power efficiency of the AR optical waveguide.

Optionally, in any of the preceding aspects, another implementation of the aspect includes, wherein the slant etched diffractive grating comprises an inorganic film deposited on the user distal surface of the transparent substrate. By employing an inorganic film instead of an organic resin, the AR optical waveguide does not degrade in the presence of sunlight. This increases the usable lifetime of the AR optical waveguide and allows the AR optical waveguide to be employed in more environments. Also, employing an inorganic film allows the AR optical waveguide to be produced by a lithography process, as opposed to an imprinting fabrication technique. This increases the production yield significantly. Further, employing a lithography process allows for more precise manufacturing, and hence allows for increased optimization of the optical components for better visual quality.

Optionally, in any of the preceding aspects, another implementation of the aspect includes, wherein the slant etched diffractive grating includes silicon nitride ($Si_3N_4$), hafnium dioxide ($HfO_2$), titanium dioxide ($TiO_2$), niobium pentoxide ($Nb_2O_5$), zinc peroxide ($ZnO_2$), tantalum pentoxide ($Ta_2O_5$), zirconium dioxide ($ZrO_2$), or combinations thereof.

Optionally, in any of the preceding aspects, another implementation of the aspect includes, wherein the slant etched diffractive grating includes a thickness of between 100 nanometers (nm) to 2000 nm.

Optionally, in any of the preceding aspects, another implementation of the aspect includes, wherein the slant etched diffractive grating is etched from the transparent substrate. By etching the diffractive grating directly from the substrate, instead of employing an organic resin, the AR optical waveguide does not degrade in the presence of sunlight. This increases the usable lifetime of the AR optical waveguide and allows the AR optical waveguide to be employed in more environments. Also, employing a direct etched diffractive grating allows the AR optical waveguide to be produced by a lithography process, as opposed to an imprinting fabrication technique. This increases the production yield significantly. Further, employing a lithography process allows for more precise manufacturing, and hence allows for increased optimization of the optical components for better visual quality.

Optionally, in any of the preceding aspects, another implementation of the aspect includes, wherein the slant etched diffractive grating includes glass.

Optionally, in any of the preceding aspects, another implementation of the aspect includes, wherein the slant etched diffractive grating comprises a hardness of greater than five Hardness (H). By employing an inorganic film with a hardness of greater than 5H or etching the diffractive grating directly from a glass substrate with a hardness of greater than 5H, the durability/scratch resistance of the AR optical waveguide is increased.

Optionally, in any of the preceding aspects, another implementation of the aspect includes, wherein the refractive index of the slant etched diffractive grating is included in a range of 2.0 to 2.6.

Optionally, in any of the preceding aspects, another implementation of the aspect includes, wherein the transparent substrate includes a refractive index of greater than or equal to 2.0.

In an embodiment, the disclosure includes a method. The method comprises applying a photoresist coating to a transparent substrate, and performing lithography to the photoresist coating. The photoresist coating is developed. Angular directional reactive ion etching is performed through the photoresist coating to create a slant etched diffractive grating on a user distal surface of the transparent substrate. The slant etched diffractive grating includes a refractive index of greater than or equal to 2.0. By employing material with a greater refractive index, a greater field of view (FOV) can be achieved for the produced AR optical waveguide. Further, employing an increased reactive index mitigates loss of computer generated light, which increases the power efficiency of the AR optical waveguide.

Optionally, in any of the preceding aspects, another implementation of the aspect includes, wherein the slant etched diffractive grating is etched from the transparent substrate. By etching the diffractive grating directly from the substrate, instead of employing an organic resin, the AR optical waveguide does not degrade in the presence of sunlight. This increases the usable lifetime of the AR optical waveguide and allows the AR optical waveguide to be employed in more environments. Also, employing a direct etched diffractive grating allows the AR optical waveguide to be produced by a lithography process, as opposed to an imprinting fabrication technique. This increases the production yield significantly. Further, employing a lithography process allows for more precise manufacturing, and hence allows for increased optimization of the optical components for better visual quality.

Optionally, in any of the preceding aspects, another implementation of the aspect includes, wherein the slant etched diffractive grating includes glass.

Optionally, in any of the preceding aspects, another implementation of the aspect includes, further comprising depositing an inorganic film onto the transparent substrate before applying the photoresist coating, wherein the slant etched diffractive grating is etched from the inorganic film. By employing an inorganic film instead of an organic resin, the AR optical waveguide does not degrade in the presence of sunlight. This increases the usable lifetime of the AR optical waveguide and allows the AR optical waveguide to be employed in more environments. Also, employing an inorganic film allows the AR optical waveguide to be produced by a lithography process, as opposed to an imprinting fabrication technique. This increases the production yield significantly. Further, employing a lithography process allows for more precise manufacturing, and hence allows for increased optimization of the optical components for better visual quality.

Optionally, in any of the preceding aspects, another implementation of the aspect includes, wherein the slant etched diffractive grating includes $Si_3N_4$, $HfO_2$, $TiO_2$, $Nb_2O_5$, $ZnO_2$, $Ta_2O_5$, $ZrO_2$, or combinations thereof.

Optionally, in any of the preceding aspects, another implementation of the aspect includes, wherein the inorganic film includes a thickness of between 100 nm to 2000 nm.

Optionally, in any of the preceding aspects, another implementation of the aspect includes, wherein the slant etched diffractive grating comprises a hardness of greater than five H. By employing an inorganic film with a hardness of greater than 5H or etching the diffractive grating directly from a glass substrate with a hardness of greater than 5H, the durability/scratch resistance of the AR optical waveguide is increased.

Optionally, in any of the preceding aspects, another implementation of the aspect includes, wherein the refractive index of the slant etched diffractive grating is included in a range of 2.0 to 2.6.

Optionally, in any of the preceding aspects, another implementation of the aspect includes, wherein the transparent substrate includes a refractive index of greater than or equal to 2.0.

In an embodiment, the disclosure includes an Augmented Reality (AR) optical waveguide prepared by a process including any of the preceding aspects.

In an embodiment, the disclosure includes an AR display including the AR optical waveguide of any of the preceding aspects.

For the purpose of clarity, any one of the foregoing embodiments may be combined with any one or more of the other foregoing embodiments to create a new embodiment within the scope of the present disclosure.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1A:
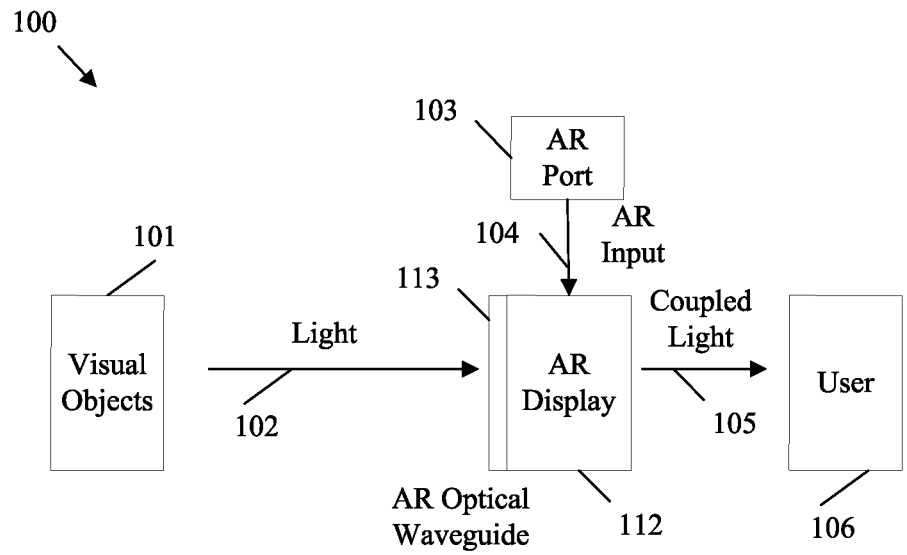
FIGS. 1A-1B are schematic diagrams of an example AR system.

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

An example AR system overlays computer generated sensory input onto real-world sensory input using a transparent waveguide with a diffractive grating. A transparent waveguide is a component that includes material capable of directing light waves. A diffractive grating is a component that includes material capable of diffracting light waves by bending such light waves in a controlled manner. In this example AR system, light waves from real-world objects pass directly through the transparent waveguide and the diffractive grating and continue toward a user's eyes. Further, computer generated light waves are injected into transparent waveguide, and the diffractive grating diffracts the computer generated light waves so that the computer generated light waves couple with the light waves from real-world objects. This results in coupled light waves that include both real-world sensory input and computer generated sensory input. Such light waves are interpreted by the user's eyes as computer generated images overlaid onto real-world images.

The diffractive grating of the abovementioned AR system is made of an organic resin, which results in several problems. As an initial matter, the organic resin degrades in sunlight, which limits the usable lifetime of such a device to less than ten thousand hours. In addition, as the organic resin degrades, the computer generated portion of the light waves become progressively dimmer from the user's perspective. Further, such devices cannot be used in direct sunlight to prevent even more rapid degradation of the organic resin. Also, the organic resin has a hardness of 1 Hardness (H) according to the pencil hardness test. This means the organic resin based diffractive grating can be easily scratched. Hence, such an AR system is fragile. Also, the organic resin based diffractive grating is created by an imprinting fabrication technique. Such a technique has a nominal end-yield of fifty eight percent. This indicates that approximately fifty eight percent of the AR waveguides in each production batch are functional, while the remaining forty two percent are discarded. This is due to a loss of approximately ten percent of the AR waveguides during resin coating, a loss of approximately twenty percent of the remaining AR waveguides during imprinting, and a loss of approximately twenty percent of the remaining AR waveguides during a demolding process. Further, the imprinting fabrication technique has a design factor accuracy and tolerance of about ten percent, which limits control of diffractive grating depths and spacing and hence reduces visual quality. Finally, the organic resin materials have a maximum effective refractive index of 1.72, where a refractive index is a dimensionless value that indicates the speed of light in a vacuum divided by the speed of light through a medium. Such refractive index limits the waveguide's ability to focus the computer generated light, and hence limits the achievable field of view (FOV) of the computer generated items that can be presented to the user by the AR system. Also, such refractive index results in diffraction efficiency of about one percent, which indicate the percentage of the computer generated light waves that are actually transmitted to the user's eyes. Hence, approximately ninety nine percent of the computer generated light waves are lost by such an AR system, which is power inefficient.

Disclosed herein are various improved AR waveguides along with manufacturing processes to create such improved AR waveguides. The AR waveguide includes a high refractive index transparent substrate, such as glass. As used herein, a high refractive index is a refractive index of about 2.0 or greater. In one example, the AR waveguide includes a slant edge diffractive grating made of an inorganic material. Such material may include silicon nitride ($Si_3N_4$), hafnium dioxide ($HfO_2$), titanium dioxide ($TiO_2$), niobium pentoxide ($Nb_2O_5$), zinc peroxide ($ZnO_2$), tantalum pentoxide ($Ta_2O_5$), zirconium dioxide ($ZrO_2$), or combinations thereof. Such materials include a refractive index of 2.0 to 2.6. In another example, the AR waveguide includes a slant edge diffractive grating directly etched into the transparent substrate. Hence, the disclosed slant edge diffractive gratings result in an improved available FOV and an increased diffraction efficiency (e.g., greater than two percent). Further, the disclosed slant edge diffractive gratings have a hardness in excess of 5H, and are hence scratch resistant. Also, the inorganic materials/transparent substrate do not degrade in sunlight, which allows the AR system to be used outside and removes the ten thousand hour usable limitation of the AR system. Further, the disclosed slant edge diffractive gratings can be fabricated by a lithography process with a nominal end-yield of approximately seventy seven percent (a yield increase of approximately nineteen percent over organic resin). Further, the accuracy and tolerance of the lithography process may be less than five percent, which is about double the accuracy and tolerance of an imprinting process. Hence, the slant edge diffractive gratings disclosed herein can be produced more accurately, which provides greater flexibility for optimization.

Figure 1B:
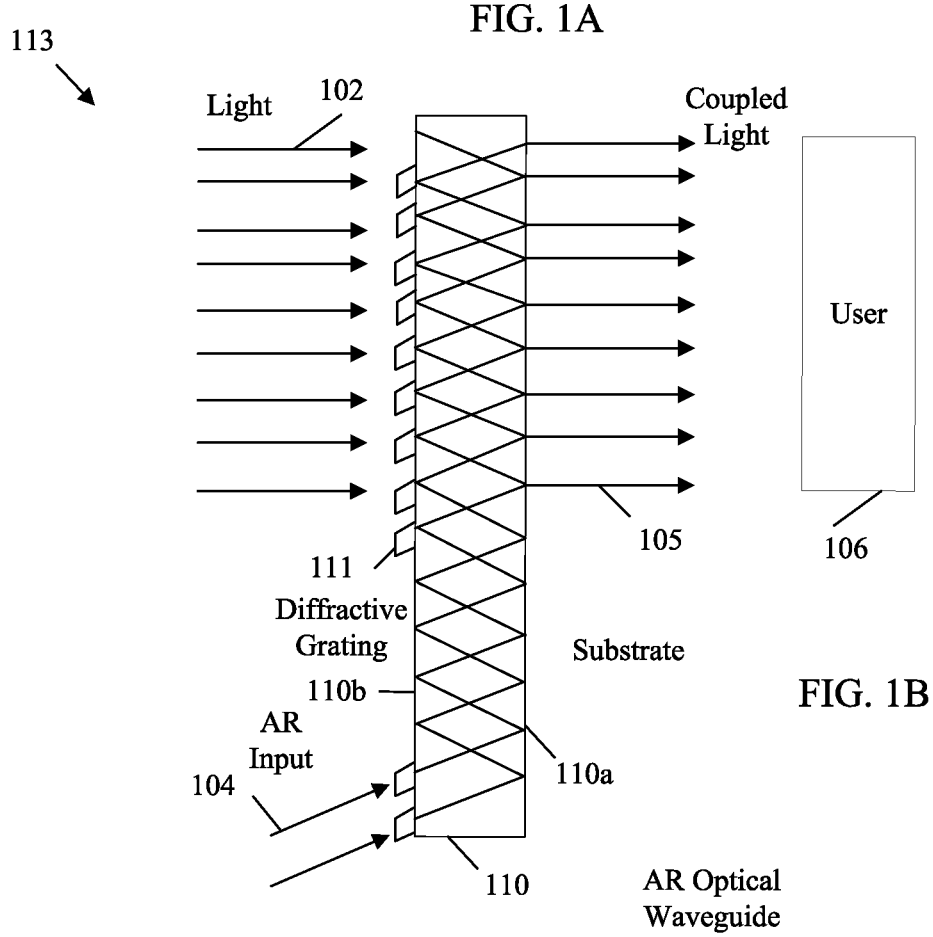

FIGS. 1A-1B are schematic diagrams of an example AR system 100. Referring first to FIG. 1A, the AR system 100 is employed by a user 106 to view both visual objects 101 and computer graphics overlaid onto the visual objects 101 on an AR display 112 screen. The visual objects 101 are any objects within the user's 106 FOV. Light 102 bounces off the visual objects 101 and propagates toward the user's 106 eyes. The light 102 from the visual objects 101 passes through the AR display 112 on the way to the user 106.

The AR display 112 is a device configured to overlay light representing computer generated graphics onto the light 102 from the visual objects 101 for view by the user 106. Specifically, the AR display 112 may be coupled to an AR port 103, which is any interface configured to forward AR input 104 from a computer. AR input 104 contains computer generated graphics as either encoded data or as light waves, depending on the example. The AR display 112 either receives and coverts the encoded data in the AR input 104 into light waves or receives and channels the AR input 104 as light waves, depending on the example. Regardless of the example, the AR display 112 screen includes a transparent AR optical waveguide 113. The light 102 from the visual objects 101 passes through the AR optical waveguide 113. The AR optical waveguide 113 also channels and/or diffracts the AR input 104 so that the AR input 104 combines with the light 102 to create coupled light 105. Hence, the coupled light 105 contains computer generated light/graphics from the AR input 104 overlaid onto the light 102 from the visual objects 101. The coupled light 105 is then viewed by the user 106.

Referring to FIG. 1B, the AR optical waveguide 113 includes a transparent substrate 110 with a user proximate surface 110a pointing toward the user 106 and a user distal surface 110b pointing away from the user 106. The transparent substrate 110 may contain any transparent material, such as glass, with a hardness sufficient to provide durability and refractive index sufficient to channel light. The AR optical waveguide 113 also includes a diffractive grating 111 included on the user distal surface 110b of the transparent substrate 110. The diffractive grating 111 is slant etched. This allows light 102 to pass through the diffractive grating 111 and the transparent substrate 110. Meanwhile, the AR input 104 light is input into the AR optical waveguide 113 at an angle based on the angle of the slants in the diffractive grating 111. The AR input 104 diffracts through the transparent substrate 110, and the diffractive grating 111 assists in maintaining the AR input in the transparent substrate 110 from the user distal surface 110b. This configuration allows the AR input 104 to couple with the light 102 and exit the substrate on the user proximate surface 110a as coupled light 105 forwarded toward the user 106. To perform such coupling, the diffractive grating 111 includes grating posts that are slanted at an angle to channel the AR input 104 toward the light. For example, the sides of the grating posts may be slanted at an angle of between about one degree to about fifty degrees relative to a normal axis that is perpendicular to the user distal surface 11b.

As shown, the diffractive grating 111 is employed to ensure that AR input 104 is properly coupled to the light 102. Accordingly, if the diffractive grating 111 is either scratched off or allowed to degrade, the AR function of the system 100 becomes inoperative. The following FIGS. disclose example AR optical waveguides 113 and method of manufacturing/producing such AR optical waveguides 113. Specifically, the diffractive grating 111 can be manufactured out of inorganic material and/or out of the same material as the transparent substrate 110. This results in AR optical waveguide 113 that is not susceptible to degradation in sunlight, scratch resistant, and more efficient than an AR optical waveguide 113 with a diffractive grating 111 made of organic resin. Specifically, the diffractive grating 111 of inorganic material/transparent substrate has greater diffraction efficiency and allows for a greater FOV. Further, by employing a diffractive grating 111 of inorganic material and/or transparent substrate 110 material, a lithography process can be employed with many benefits over resin imprinting.

Figure 2:
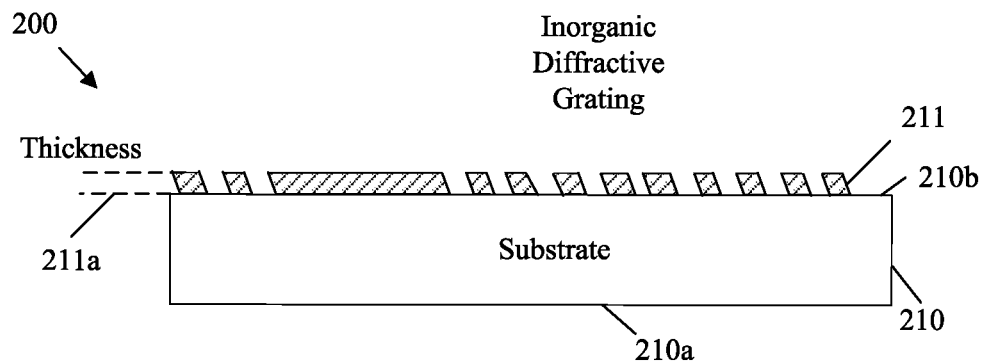
FIG. 2 is a schematic diagram of an example AR optical waveguide with an inorganic slant etched diffractive grating.

FIG. 2 is a schematic diagram of an example AR optical waveguide 200 with an inorganic slant etched diffractive grating. The AR optical waveguide 200 is an example implementation of AR optical waveguide 113. The AR optical waveguide 200 includes a transparent substrate 210 including a user proximate surface 210a designed to be pointed toward a user and a user distal surface 210b designed to be pointed away from the user. The transparent substrate 210 may be made of glass and includes a high refractive index. Accordingly, the transparent substrate 210 includes a refractive index of greater than or equal to 2.0.

The AR optical waveguide 200 also includes a slant etched diffractive grating 211 included on the user distal surface 210b of the transparent substrate 210. The slant etched diffractive grating 211 includes a refractive index of greater than or equal to 2.0. The slant etched diffractive grating 211 comprises an inorganic film deposited on the user distal surface 210b of the transparent substrate 210, which may be etched into the desired slanted shape. The inorganic film of the slant etched diffractive grating 211 may include a thickness 211a of between 100 nanometers (nm) to 2000 nm. The inorganic film of the slant etched diffractive grating 211 may include Si3N4, HfO2, TiO2, Nb2O5, ZnO2, Ta2O5, ZrO2, or combinations thereof. Such materials have approximate refractive indices of 2.1, 2.1, 2.6, 2.4, 2.0, 2.17, and 2.13, respectively. Hence, the refractive index of the slant etched diffractive grating 211 may be included in a range of approximately 2.0 to approximately 2.6. The high refraction index of the slant etched diffractive grating 211 and/or the transparent substrate 210 allows the diffraction efficiency for the AR optical waveguide 200 to remain above two percent (vs one percent for organic resin). This allows for less loss of computer generated optical information and for a greater FOV for the display. Further, such materials have a better adhesion to the transparent substrate 210 than an organic resin as such materials may be deposited by vacuum coating. Further, such materials cause the slant etched diffractive grating 211 to have a hardness of greater than 5H according to the pencil hardness test. Accordingly, the slant etched diffractive grating 211 is scratch resistant. Further, the inorganic film of the slant etched diffractive grating 211 is not susceptible to degradation due to sunlight. For example, the inorganic film of the slant etched diffractive grating 211 is durable/reliable in the presence of ultraviolet (UV) radiation and moisture.

Figure 3:
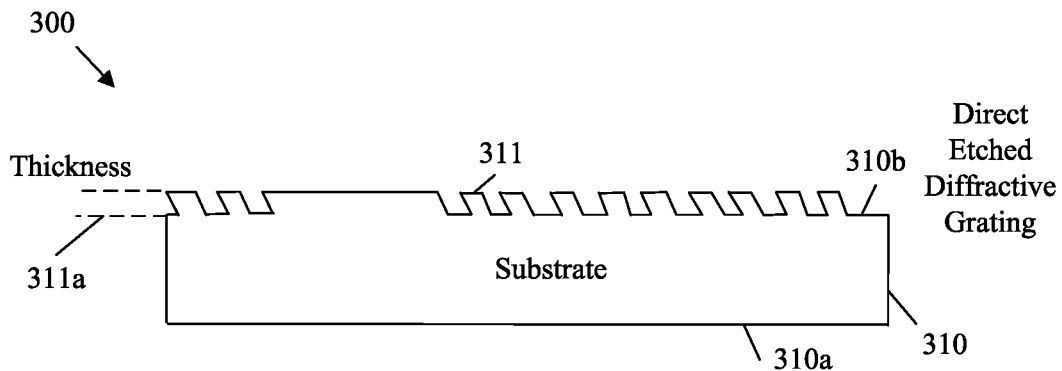
FIG. 3 is a schematic diagram of an example AR optical waveguide with a direct etched diffractive grating.

FIG. 3 is a schematic diagram of an example AR optical waveguide 300 with a direct etched diffractive grating. The AR optical waveguide 300 is an example implementation of AR optical waveguide 113. The AR optical waveguide 300 includes a transparent substrate 310 including a user proximate surface 310a designed to be pointed toward a user and a user distal surface 310b designed to be pointed away from the user. The transparent substrate 310 may be made of glass and includes a high refractive index. Accordingly, the transparent substrate 310 includes a refractive index of greater than or equal to 2.0.

The AR optical waveguide 300 also includes a slant etched diffractive grating 311 included on the user distal surface 310b of the transparent substrate 310. In this example, the slant etched diffractive grating 311 is directly etched from the transparent substrate 310. Hence, the slant etched diffractive grating 311 may also include glass. As such, the transparent substrate 310 and the slant etched diffractive grating 311 both include a refractive index of greater than or equal to 2.0. The slant etched diffractive grating 311 may include similar qualities to the slant etched diffractive grating 211. For example, the slant etched diffractive grating 311 may exceed a hardness of 5H according to a pencil hardness test, and may be highly scratch resistant. The slant etched diffractive grating 311 may also include a thickness 311a of between 100 nm to 2000 nm. Further, the slant etched diffractive grating 311 does not degrade in sunlight, is resistant to UV radiation, and is resistant to moisture. In addition, the high refraction index of the slant etched diffractive grating 311 and/or the transparent substrate 310 allows the diffraction efficiency for the AR optical waveguide 300 to remain above two percent (vs one percent for organic resin). This allows for less loss of computer generated optical information and for a greater FOV for the display.

Figure 4A:
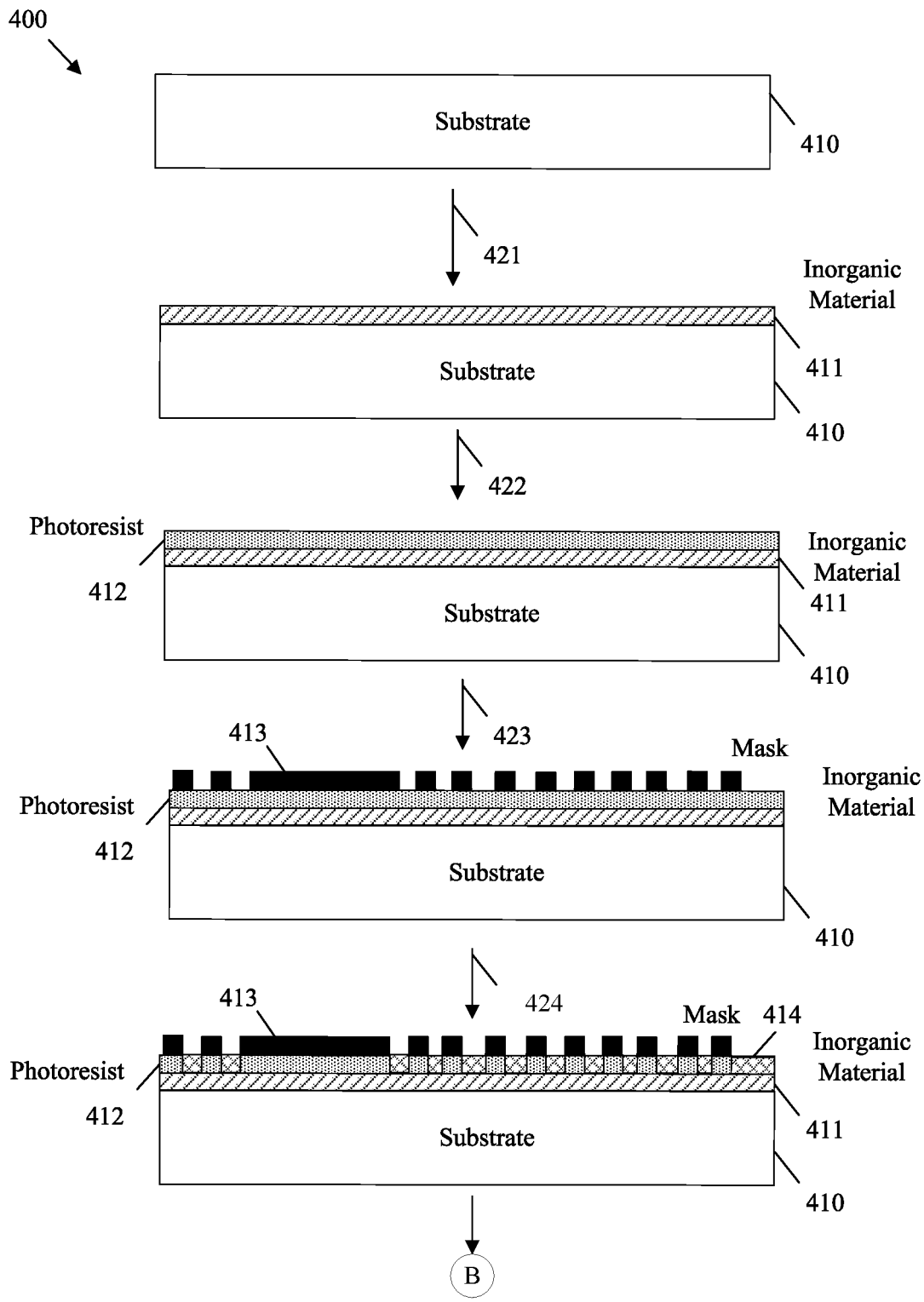
FIGS. 4A-4B are process flow diagrams for an example process of manufacturing an AR optical waveguide with an inorganic slant etched diffractive grating.
Figure 4B:
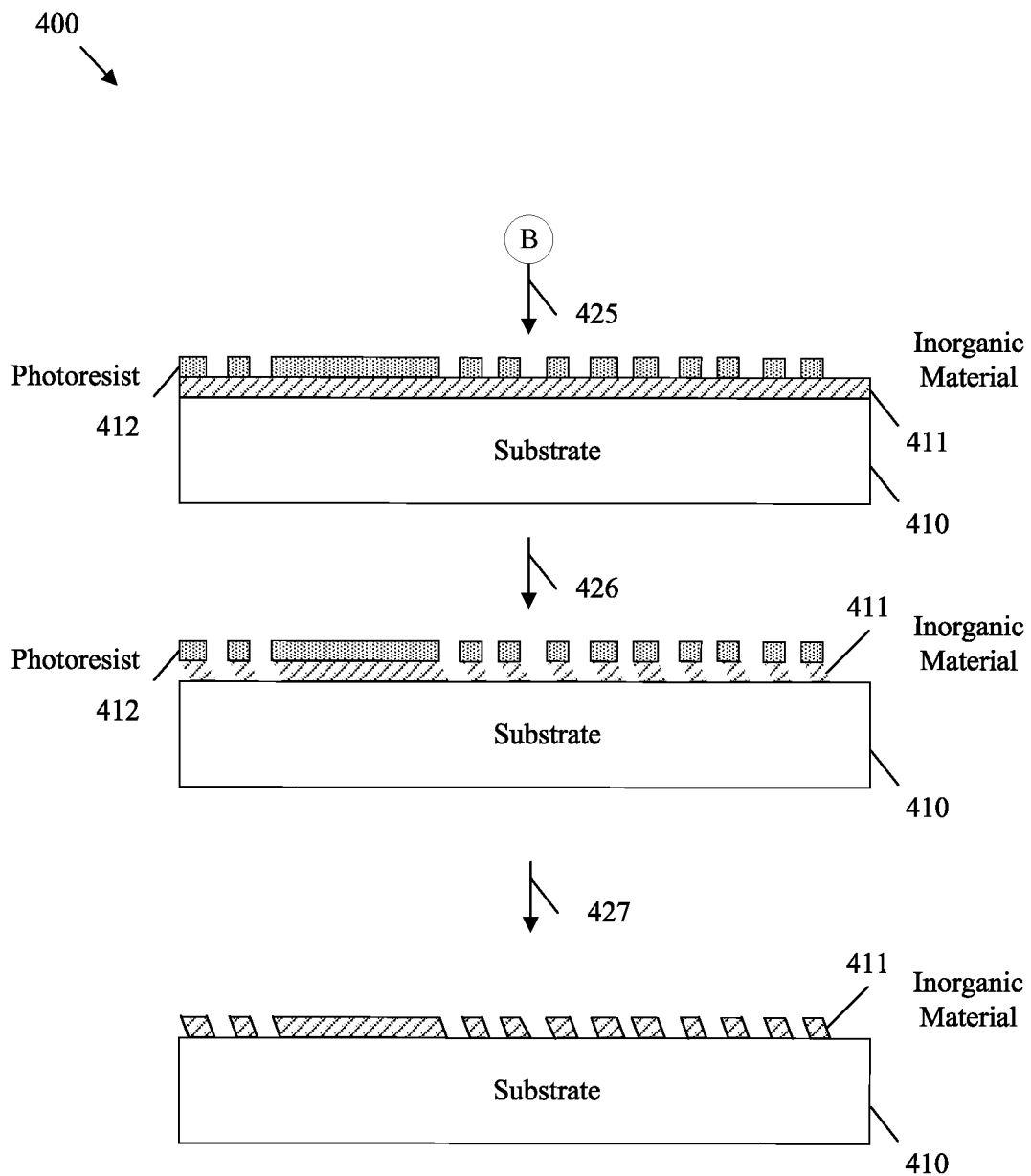

FIGS. 4A-4B are process flow diagrams for an example process 400 of manufacturing an AR optical waveguide with an inorganic slant etched diffractive grating, such as AR optical waveguide 200 with slant etched diffractive grating 211. Reference is first made to FIG. 4A.

Process 400 begins by cleaning and preparing a transparent substrate 410, which may be substantially similar to transparent substrate 210. Hence, the transparent substrate 410 may include a transparent and high refractive index material such as glass. Such cleaning may include any washing technique known in the lithography/semiconductor industry, such as wet chemical treatment by solutions of hydrogen peroxide, trichloroethylene, acetone, methanol, etc. Preparation may include application of heat to remove moisture, application of an adhesion promoter, etc.

At step 421, an inorganic material 411 is deposited onto the transparent substrate 410. The inorganic material 411 may include Si3N4, HfO2, TiO2, Nb2O5, ZnO2, Ta2O5, ZrO2, or combinations thereof. The inorganic material 411 may be deposited to a thickness of about 100 nm to about 2000 nm.

At step 422, a photoresist coating 412 is applied to the inorganic material 411, for example by spin coating. Spin coating may include spinning a wafer containing the substrate 410 to cause the photoresist coating 412 to settle to a uniform thickness. The thickness of the photoresist coating 412 may be about two micrometers (um). The photoresist coating 412 is a light sensitive material. For example, the photoresist coating 412 reacts to light so that portions of the photoresist coating 412 that have been exposed to light can be removed by a solvent while portions of the photoresist coating 412 that have not been exposed to light resist the solvent.

At step 423, a mask 413 can be positioned onto the photoresist coating 412. A mask 413 is a light blocking material with gaps positioned above areas of the photoresist coating 412 that are to be etched. Step 423 and mask 413 may be omitted in examples where direct lithography is employed.

At step 424, the photoresist coating 412 is exposed to light. For example, the photoresist coating 412 may be exposed to light according to electron beam lithography, X-ray lithography, deep ultraviolet (DUV) lithography, or other lithography process. This results in exposed portions 414 of the photoresist coating 412. The exposed portions 414 are positioned under the gaps in the mask 413 in mask based lithography or in targeted locations in direct lithography. A forty five nm lithography rule may be employed when performing the lithography process described herein. The forty five nm lithography rule ensures structures are sufficiently spaced to mitigate manufacturing errors.

Referring to FIG. 4B, the mask 413 is removed and the photoresist coating 412 is developed at step 425. Developing is a process of treating the photoresist coating 412 to create a prepared surface for controlled etching. For example, developing may include applying a developer solvent to the photoresist coating 412 via a spinner. The developer solvent removes the exposed portions 414 of the photoresist coating 412, which leaves gaps in the photoresist coating 412 above the portions of the inorganic material 411 to be etched. Accordingly, developing the photoresist coating 412 defines the area of the diffractive grating.

At step 426, an etching agent is applied to the photoresist coating 412. The etching agent continues through the gaps in the photoresist coating 412 and etches the inorganic material 411. The etching agent may be any wet and/or dry agent capable of slant etching. An example slant etching technique is discussed with respect to FIG. 6 below. For example angular directional reactive ion etching can be employed to etch the inorganic material 411 through the photoresist coating 412. This creates a slant etched diffractive grating from the inorganic material 411 on a user distal surface of the transparent substrate 410.

At step 427, the photoresist coating 412 is removed. For example, a photoresist solvent may be applied to completely remove the photoresist coating 412. For example, the photoresist coating 412 can be removed by ashing, application of liquid resist stripper, application of N-Methyl-2-pyrrolidone (NMP), etc. Once the photoresist coating 412 is removed, the transparent substrate 410 with a slant etched diffractive grating made of inorganic material 411 remains. The resulting transparent substrate 410 with a slant etched diffractive grating made of inorganic material 411 is substantially similar to AR optical waveguide 200.

Figure 5A:
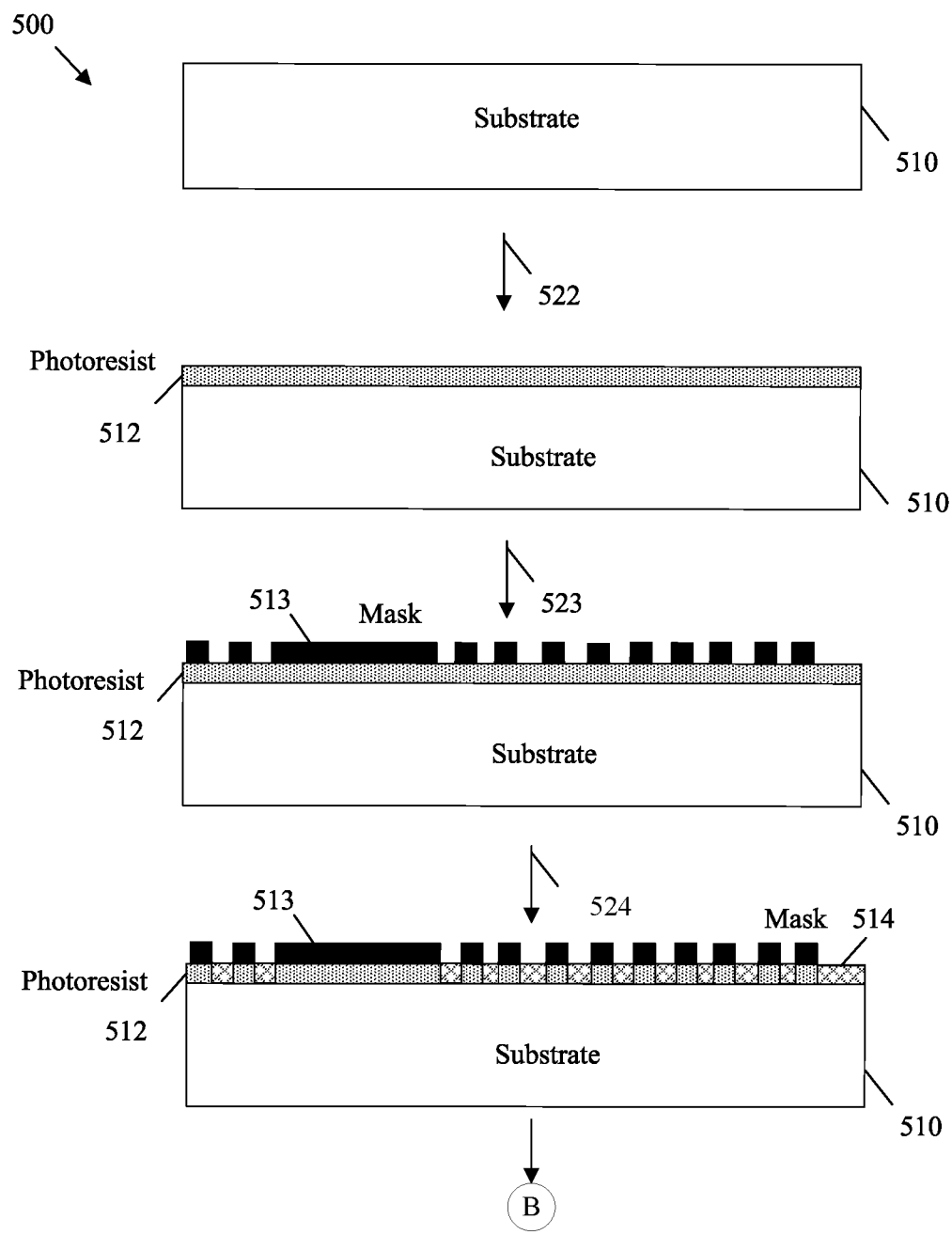
FIGS. 5A-5B are process flow diagrams for an example process of manufacturing an AR optical waveguide with a direct etched diffractive grating.
Figure 5B:
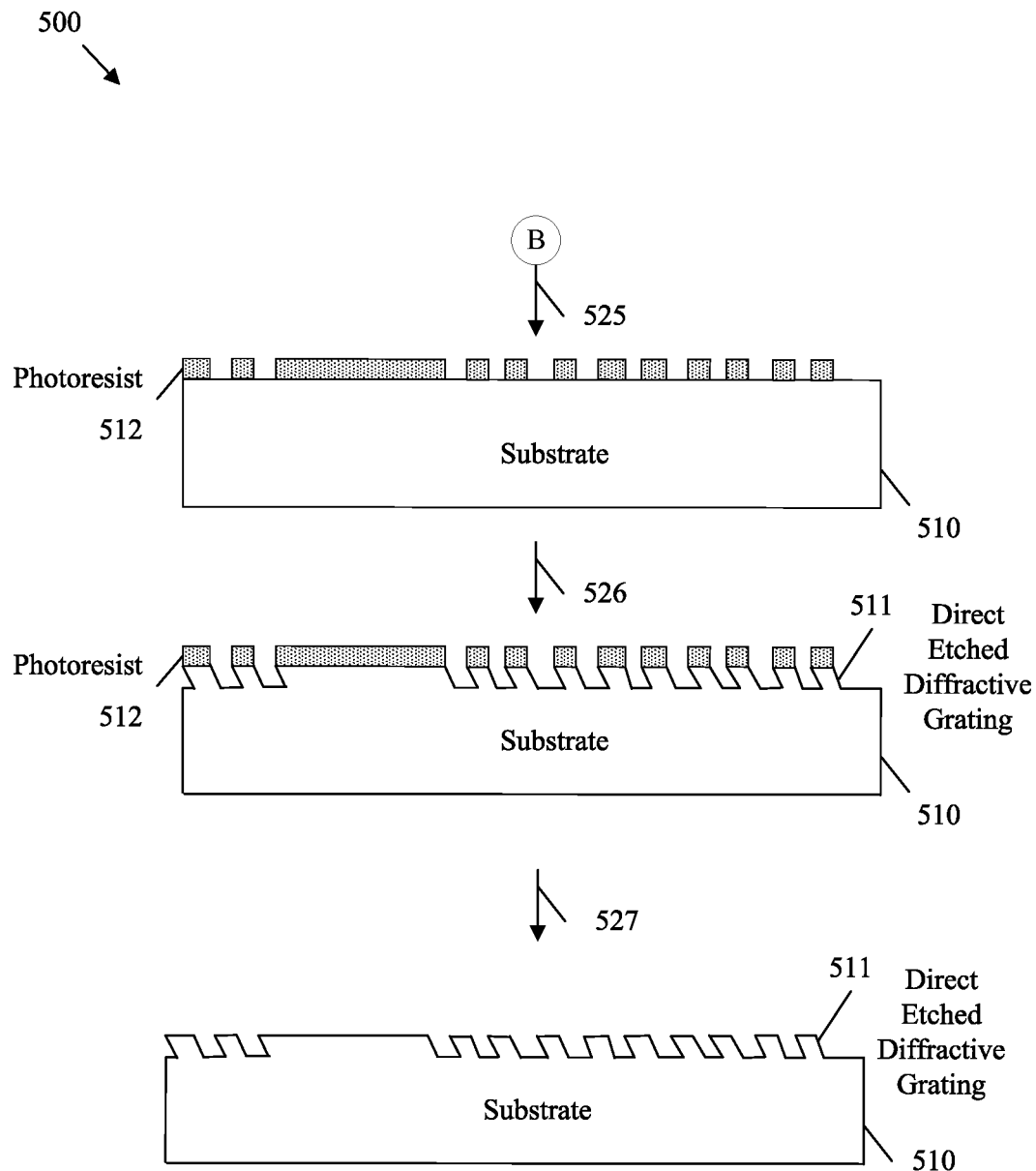

FIGS. 5A-5B are process flow diagrams for an example process 500 of manufacturing an AR optical waveguide with a direct etched diffractive grating, such as AR optical waveguide 300 with slant etched diffractive grating 311. Process 500 is substantially similar to process 400, but the inorganic material is omitted. Specifically, process 500 operates on a transparent substrate 510, a photoresist coating 512 with exposed portions 514, and a mask 513, which may be substantially similar to transparent substrate 410, photoresist coating 412, exposed portions 414, and mask 413, respectively. Further, steps 522, 523, 524, 525, 526, and 527, are similar to steps 422, 423, 424, 425, 426, and 427, respectively, except as discussed below.

At step 522, the photoresist coating 512 is applied directly to the transparent substrate 510. Further, at step 526, an etching agent is applied to the photoresist coating 512. The etching agent continues through the gaps in the photoresist coating 512 and etches the transparent substrate 510. The etching agent may be any wet and/or dry agent capable of slant etching. An example slant etching technique is discussed with respect to FIG. 6 below. For example angular directional reactive ion etching can be employed to etch the transparent substrate 510 through the photoresist coating 412. This creates a slant etched diffractive grating 511 from the transparent substrate 510 on a user distal surface of the transparent substrate 510. The slant etched diffractive grating 511 is substantially similar to slant etched diffractive grating 311. Hence, when the photoresist coating 512 is removed at step 527, transparent substrate 510 with a slant etched diffractive grating 511 made from the transparent substrate 510 remains. The resulting transparent substrate 510 with a slant etched diffractive grating 511 etched from the transparent substrate 510 are substantially similar to AR optical waveguide 300.

The AR waveguides created by process 400 and process 500 are superior to an AR waveguide created with an organic resin. An AR waveguide that includes an inorganic film and/or direct etched diffractive grating is not susceptible to UV light degradation, and hence has a semi-lifetime reliability (e.g., the diffractive grating should last as long as the screen) that is significantly higher than the lifetime of ten thousand hours of an organic resin based AR waveguide. Also, the hardness of the AR waveguides is in excess of 5H according to the pencil test, which is significantly greater than the 1H hardness of an organic resin based AR waveguide. As such, the inorganic/substrate based the AR waveguides described herein are scratch resistant, and hence more durable than an organic resin based AR waveguide. Further, the high refractive index of the AR waveguide materials (e.g., 2.0 or greater) allows for better diffraction efficiency and a better FOV than an organic resin based AR waveguide (e.g., 1.75 refractive index).

Further, the processes 400 and 500 are superior to an organic resin implantation process. For example, an organic resin implantation process has a nominal yield of about 58%. Specifically, the organic resin implantation process includes a cleaning step with a 100% yield, a resin coating step with a 90% yield, an imprinting process with an 80% yield, and a demolding process with an 80% yield, which results in the loss of about 42% of the units in each batch. In contrast, the processes 400 and 500 have a nominal yield of about 77%. For example, the processes 400 and 500 may have a cleaning step with a 100% yield, a photoresist coating step with a 95% yield, a photolithography step with a 95% yield, a developing step with a 95% yield, and a reactive ion etch process with a 90% yield, which reduces loss to about 33% of the units in each batch. Also, photolithography has an accuracy/tolerance of less than about 5% of the design factor, whereas the imprinting fabrication process for organic resin has an accuracy/tolerance of about 10% of the design factor. Accordingly, processes 400 and 500 have much greater control on grating spacing and depth control. As such, processes 400 and 500 result in an AR waveguide that is amenable to optimization. Combined with the increased refractive index, the AR waveguides produced by processes 400 and 500 are more power efficient, have a better FOV, and are more accurate than organic resin based AR waveguides.

Figure 6:
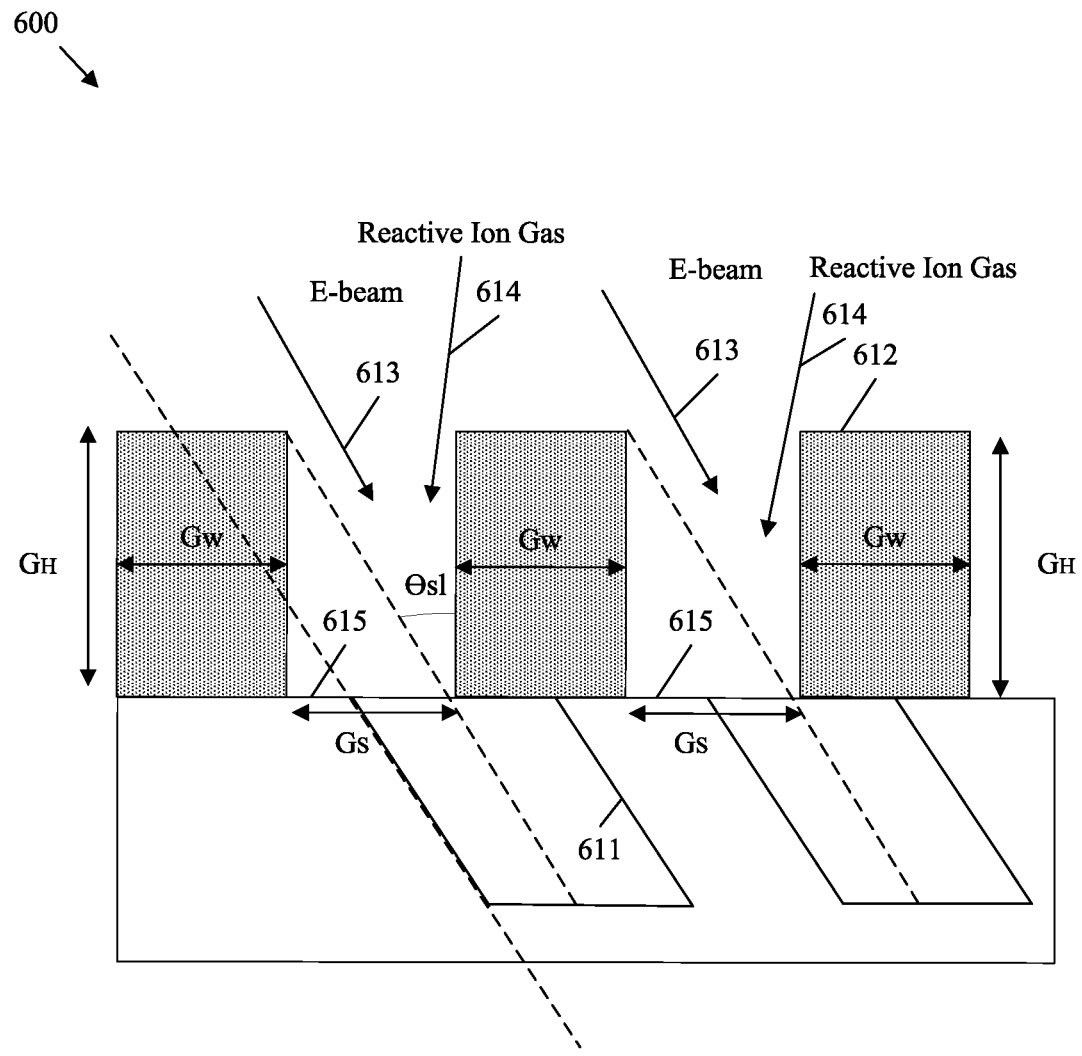
FIG. 6 is a schematic diagram of an example process for slant etching.

FIG. 6 is a schematic diagram of an example process 600 for slant etching. Process 600 is an example process that can be employed to etch diffractive grating 111, inorganic material 411, and/or slant etched diffractive grating 211, 311, and/or 511. Process 600 employs reactive ion etching (RIE). A photoresist coating 612 is positioned on a diffractive grating 611, which may be made of transparent substrate material or inorganic material as discussed above.

A reactive ion gas 614 is applied to the diffractive grating 611. The reactive ion gas 614 is selected as a gas that reacts with the material of the diffractive grating 611 in the presence of an electron beam 613. For example, the reactive ion gas 614 may include Sulfur hexafluoride ($SF_6$), Tetrafluoromethane ($CF_4$), Chlorotetraflouroethane $CCl_2F_4$, tetrafluoroborate ($BF_4$), which act as fluorine gas based sulfur or carbon compounds. In some examples, the reactive ion gas 614 may include hydrogen bromide (HBr), which acts as a bromine based hydrogen compound. The preceding group of reactive ion gases 614 may also be employed in the presence of Oxygen ($O_2$) and/or Argon (Ar) as assisted gases. The resulting reactive ion gas 614 can be employed to etch silicon dioxide ($SiO_2$) (e.g., glass). The electron beam 613 pointed at the openings in the photoresist coating 612 at a slanted grating angle ($\theta sl$). This causes the reactive ion gas 614 to etch into the diffractive grating 611 at the slanted grating angle. The angle of the etch may be a function of the thickness/height of the photoresist coating 612 sections ($G_H$), the width of the photoresist coating 612 sections ($G_W$), and the width of the gap between photoresist coating 612 sections ($G_S$) as shown in FIG. 6.

Increased reactive ion gas 614 pressure may affect the etch rate into the diffractive grating 611. For example, applying a higher reactive ion gas 614 pressure and a higher electron beam 613 power may result in increasing the directional etch rate more than the lateral/horizontal etch rate. Further, higher slanted angles may be employed for thicker diffractive gratings 611. In addition, larger values of $G_S$ allows for more flexibility in slant angles. Thinner photoresist coating 612 sections $G_H$ may reduce the effect of shadowing, which is the un-etched portion of the diffractive grating 611 adjacent to (e.g., to the right of) the photoresist coating 612 sections. Shadowing is caused by the photoresist coating 612 sections blocking the electron beam 613 because of the angle of the electron beam 613. However, the sensitivity of the material of the diffractive grating 611 to the reactive ion gas 614 may affect the allowable thickness of the photoresist coating 612. It should be noted that the etches may be of non-uniform depth due to variations in the mean free path (MFP) of the electron beam 613 at different angles across the substrate. Finally, a fill factor of 0.4 and a Length to Slant (L/S) ratio of 1:1.5 may be reasonable for the slanted diffractive grating 611.

Figure 7:
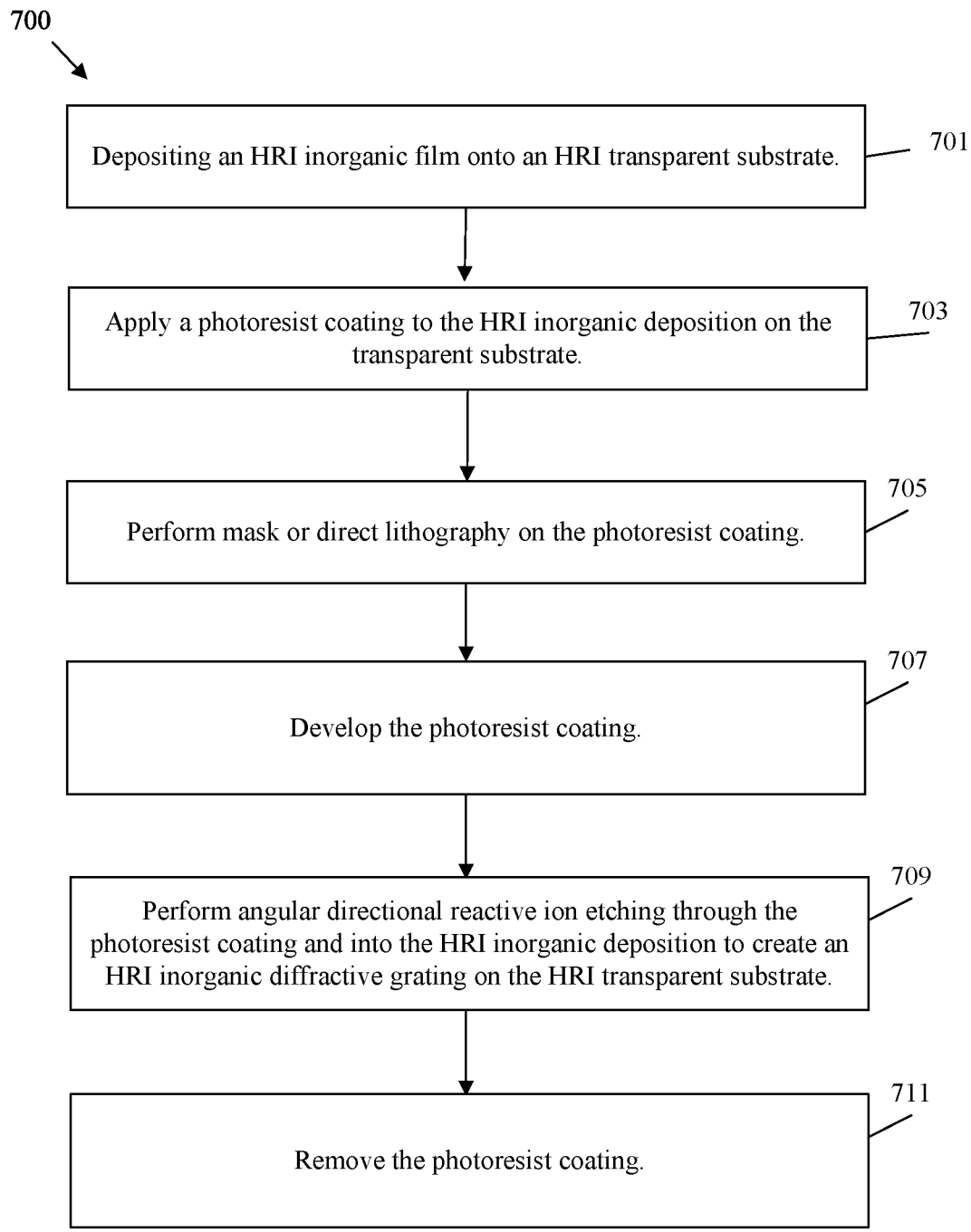
FIG. 7 is a flowchart of an example method of manufacturing an AR optical waveguide with an inorganic slant etched diffractive grating.

FIG. 7 is a flowchart of an example method 700 of manufacturing an AR optical waveguide with an inorganic slant etched diffractive grating. For example, method 700 may be employed to manufacture an AR optical waveguide 113 and/or 200, for example by implementing process 400 and employing process 600 for slant etching.

At block 701, a high refractive index inorganic film is deposited onto a high refractive index transparent substrate, for example as discussed at step 421 of process 400. Accordingly, both the inorganic film and the transparent substrate have a refractive index of greater than or equal to 2.0. The inorganic film, which acts as a slant etched diffractive grating in method 700, can include $Si_3N_4$, $HfO_2$, $TiO_2$, $Nb_2O_5$, $ZnO_2$, $Ta_2O_5$, $ZrO_2$, or combinations thereof. Depending on the material selected, the inorganic film/slant etched diffractive grating may have a refractive index included in a range of 2.0 to 2.6. In method 700, the inorganic film is deposited before applying a photoresist coating at block 703, which allows the slant etched diffractive grating to be etched from the inorganic film. The inorganic film may be deposited to include a thickness of between 100 nm to 2000 nm. Depending on the material selected for the inorganic film, the resulting slant etched diffractive grating includes varying levels of hardness. However, the materials listed all result in a hardness of greater than 5H.

At block 703, a photoresist coating is applied to the transparent substrate, for example as discussed at step 422 of process 400. As the inorganic film is previously applied to the transparent substrate at block 701, the photoresist coating is applied to the transparent substrate by applying the photoresist coating to the inorganic film on the transparent substrate.

At block 705, lithography is performed on the photoresist coating applied at block 703, for example as discussed at steps 423 and/or 424 of process 400. The lithography can be performed by positioning a mask over the photoresist coating and exposing the photoresist coating to an electron beam, X-ray, DUV, or other lithography beam. In another example, the mask is not used and the lithography beam is employed to directly target the areas of the photoresist coating that should be exposed.

At block 707, the photoresist coating is developed to remove the portions of the photoresist coating that have been exposed to the lithography beam, for example as discussed at step 425 of process 400. This leaves gaps in the photoresist coating above the portions of the inorganic material to be etched to create the diffractive grating.

At block 709, angular directional reactive ion etching is performed through the photoresist coating to create a slant etched diffractive grating on a user distal surface of the transparent substrate, for example as discussed at step 426 of process 400 and/or as discussed in process 600. Specifically, the angular directional reactive ion etching is performed on the inorganic deposition of block 701 to create a high refractive index inorganic diffractive grating that includes a refractive index of greater than or equal to 2.0. At block 711, the photoresist coating is removed, for example as discussed at step 427 of process 400. The resulting transparent substrate with the slant etched diffractive grating etched from the inorganic film is substantially similar to AR optical waveguide 200.

Figure 8:
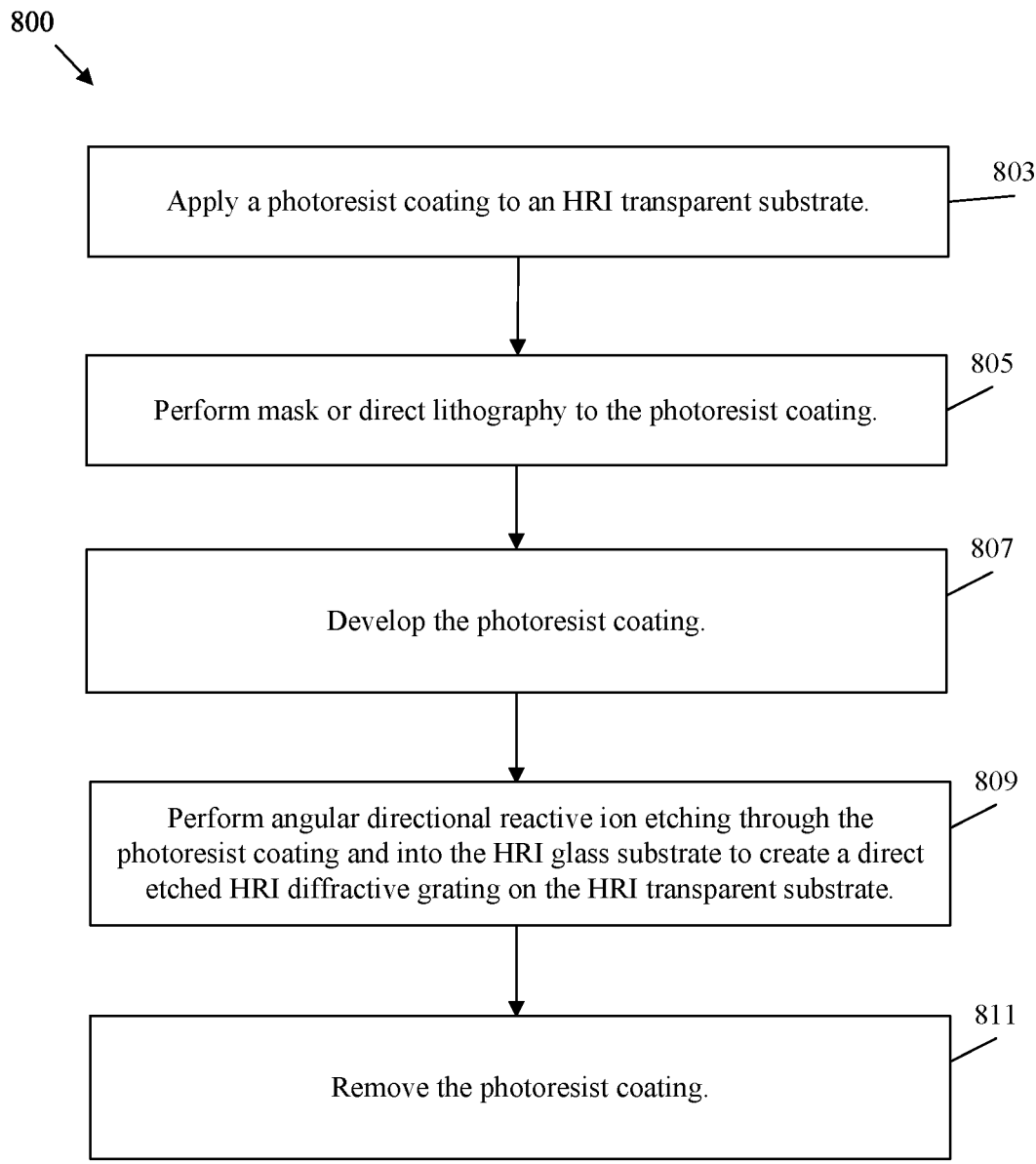
FIG. 8 is a flowchart of an example method of manufacturing an AR optical waveguide with a direct etched diffractive grating.

FIG. 8 is a flowchart of an example method 800 of manufacturing an AR optical waveguide with a direct etched diffractive grating. For example, method 800 may be employed to manufacture an AR optical waveguide 113 and/or 300, for example by implementing process 500 and employing process 600 for slant etching.

Method 800 includes blocks 803, 805, 807, 809, and 811, which are similar to blocks 703, 705, 707, 709, and 711, respectively, except as discussed below. Specifically, method 800 omits the deposition of the inorganic film. Accordingly, at block 803, the photoresist coating is applied to the transparent substrate, for example as discussed at step 522 of process 500. As the inorganic film is not included, the photoresist coating is applied directly to the transparent substrate.

Further, at block 809, angular directional reactive ion etching is performed through the photoresist coating to create a slant etched diffractive grating on a user distal surface of the transparent substrate, for example as discussed at step 526 of process 500 and/or as discussed in process 600. This results in the creation of a slant etched diffractive grating that is directly etched from the transparent substrate. Hence, the slant etched diffractive grating of method 800 can include glass and/or any other material included in the transparent substrate. Further, the substrate includes a refractive index of 2.0 or greater and a hardness of over 5H. Accordingly, the slant etched diffractive grating that is etched from the transparent substrate also includes a refractive index of 2.0 or greater and a hardness of over 5H. The resulting transparent substrate with the slant etched diffractive grating etched directly from the transparent substrate is substantially similar to AR optical waveguide 300.

A first component is directly coupled to a second component when there are no intervening components, except for a line, a trace, or another medium between the first component and the second component. The first component is indirectly coupled to the second component when there are intervening components other than a line, a trace, or another medium between the first component and the second component. The term "coupled" and its variants include both directly coupled and indirectly coupled. The use of the term "about" means a range including ±10% of the subsequent number unless otherwise stated.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, components, techniques, or methods without departing from the scope of the present disclosure. Other examples of changes, substitutions, and alterations are ascertainable by one skilled in the art and may be made without departing from the spirit and scope disclosed herein.

What is claimed is:

1. An Augmented Reality (AR) optical waveguide comprising:
   a transparent substrate including a user proximate surface and a user distal surface; and
   a slant etched diffractive grating included on the user distal surface of the transparent substrate, wherein the slant etched diffractive grating includes a refractive index of greater than or equal to 2.0 and has a thickness of less than 200 nanometers (nm), and wherein the slant etched diffractive grating includes zinc peroxide ($ZnO_2$).

2. The AR optical waveguide of claim 1, wherein the slant etched diffractive grating is etched from an inorganic film deposited on the user distal surface of the transparent substrate.

3. The AR optical waveguide of claim 1, wherein the slant etched diffractive grating includes silicon nitride ($Si_3N_4$), hafnium dioxide ($HfO_2$), titanium dioxide ($TiO_2$), niobium pentoxide ($Nb_2O_5$), tantalum pentoxide ($Ta_2O_5$), zirconium dioxide ($ZrO_2$), or combinations thereof.

4. The AR optical waveguide of claim 1, wherein the thickness of the slant etched diffractive grating is greater than 100 nm.

5. The AR optical waveguide of claim 1, wherein the slant etched diffractive grating is etched from the transparent substrate.

6. The AR optical waveguide of claim 1, wherein the slant etched diffractive grating includes glass.

7. The AR optical waveguide of claim 1 wherein the slant etched diffractive grating comprises a hardness of greater than five Hardness (H).

8. The AR optical waveguide of claim 1, wherein the refractive index of the slant etched diffractive grating is included in a range of 2.0 to 2.6.

9. The AR optical waveguide of claim 1, wherein the transparent substrate includes a refractive index of greater than or equal to 2.0.

10. An Augmented Reality (AR) system, comprising:
    an AR port; and
    an AR optical waveguide configured to receive AR input from the AR port, the AR optical waveguide including:
       a transparent substrate including a user proximate surface and a user distal surface; and
       a slant etched diffractive grating included on the user distal surface of the transparent substrate, wherein the slant etched diffractive grating includes a refractive index of greater than or equal to 2.0 and has a thickness of less than 200 nanometers (nm),
    wherein the AR optical waveguide is configured to combine the AR input with received light to create coupled light, and
    wherein the slant etched diffractive grating includes zinc peroxide ($ZnO_2$).

11. The AR system of claim 10, wherein the AR optical waveguide is configured to diffract the AR input so that the AR input can be combined with the received light, and wherein the thickness of the slant etched diffractive grating is greater than 100 nm.

12. The AR system of claim 10, wherein the slant etched diffractive grating is etched from an inorganic film deposited on the user distal surface of the transparent substrate.

13. The AR system of claim 10, wherein the slant etched diffractive grating includes silicon nitride ($Si_3N_4$), hafnium dioxide ($HfO_2$), titanium dioxide ($TiO_2$), niobium pentoxide ($Nb_2O_5$), tantalum pentoxide ($Ta_2O_5$), zirconium dioxide ($ZrO_2$), or combinations thereof.

14. The AR system of claim 10, wherein the slant etched diffractive grating is etched from the transparent substrate.

15. The AR system of claim 10, wherein the slant etched diffractive grating includes glass.

16. The AR system of claim 10, wherein the slant etched diffractive grating comprises a hardness of greater than five Hardness (H).

17. The AR system of claim 10, wherein the refractive index of the slant etched diffractive grating is included in a range of 2.0 to 2.6.

18. The AR system of claim 10, wherein the transparent substrate includes a refractive index of greater than or equal to 2.0.

* * * * *